United States Patent
Chang et al.

(10) Patent No.: US 6,969,890 B2
(45) Date of Patent: Nov. 29, 2005

(54) STRUCTURE OF THIN FILM TRANSISTOR (75) Inventors: Kow Ming Chang, Taipei (TW); Yuan Hung Chung, Taipei (TW)

(73) Assignee: National Chiao Tung University, Hsinchu (TW)

( * ) Notice: Subject to any disclaimer, the term of this patent is extended or adjusted under 35 U.S.C. 154(b) by 51 days.

(21) Appl. No.: 10/632,641

(22) Filed: Aug. 1, 2003

(65) Prior Publication Data

US 2004/0061174 A1 Apr. 1, 2004

Related U.S. Application Data (62) Division of application No. 10/259,137, filed on Sep. 26, 2002, now abandoned.

(51) Int. Cl.[7] .............................................. H01L 29/72
(52) U.S. Cl. ...................... 257/347; 257/348; 257/365; 257/401; 257/406; 257/411
(58) Field of Search ................................ 257/347, 348, 257/365, 401, 406, 411

(56) References Cited

U.S. PATENT DOCUMENTS

| | | |
|---|---|---|
| 4,426,407 A | 1/1984 | Morin et al. .................. 427/86 |
| 4,700,461 A | 10/1987 | Choi et al. .................... 437/41 |
| 5,091,763 A | 2/1992 | Sanchez ..................... 357/23.9 |
| 5,358,879 A | 10/1994 | Brady et al. .................. 437/44 |
| 5,498,555 A | 3/1996 | Lin ............................. 437/35 |
| 5,599,726 A | 2/1997 | Pan ............................ 437/41 |
| 5,620,914 A | 4/1997 | Hikida et al. ............... 438/304 |
| 5,693,549 A | * 12/1997 | Kim .......................... 257/421 |
| 5,811,283 A | 9/1998 | Sun ............................ 438/244 |
| 5,877,058 A | 3/1999 | Gardner et al. ............. 438/304 |
| 6,064,090 A | 5/2000 | Miyamoto et al. .......... 257/347 |
| 6,107,130 A | 8/2000 | Fulford, Jr. et al. ........ 438/231 |
| 6,399,451 B1 | 6/2002 | Lim et al. ................... 438/303 |

FOREIGN PATENT DOCUMENTS

KR    2001036727 A   *  5/2001   ................. 257/347

* cited by examiner

Primary Examiner—Edward Wojciechowicz
(74) Attorney, Agent, or Firm—Haverstock & Owens LLP (57) ABSTRACT

A method of manufacturing a thin film transistor for solving the drawbacks of the prior art is disclosed. The method includes steps of providing an insulating substrate, sequentially forming a source/drain layer, a primary gate insulating layer, and a first conducting layer on the insulating substrate, etching the first conducting layer to form a primary gate; sequentially forming a secondary gate insulating layer and a second conducting layer on the primary gate; and etching the second conducting layer to form a first secondary gate and a second secondary gate.

22 Claims, 7 Drawing Sheets

STRUCTURE OF THIN FILM TRANSISTOR

This is a divisional of U.S. patent application Ser. No. 10/259,137, filed Sep. 26, 2002, now abandoned the contents of which are hereby incorporated by reference.

FIELD OF THE INVENTION

The present invention is related to a structure of a thin film transistor and a manufacturing method thereof, and more particularly to a structure of a thin film transistor applied to TFT-LCD and a manufacturing method thereof.

BACKGROUND OF THE INVENTION

Thin film transistor liquid crystal Display (TFT-LCD) has become one of the most popular and modern information goods. As result of being light, small and portable, having a lower operating voltage, being free of harmful radiation and suited to production on large scale, TFT-LCD substitutes for cathode ray tube display as a caressed computer display device.

In accordance with the structure of TFT-LCD, Drain of TFT has a higher electric field while TFT is operating, and there should be an off-state leakage current resulted while the device is shut down, thereby the application of TFT-LCD being limited.

Figure 1:
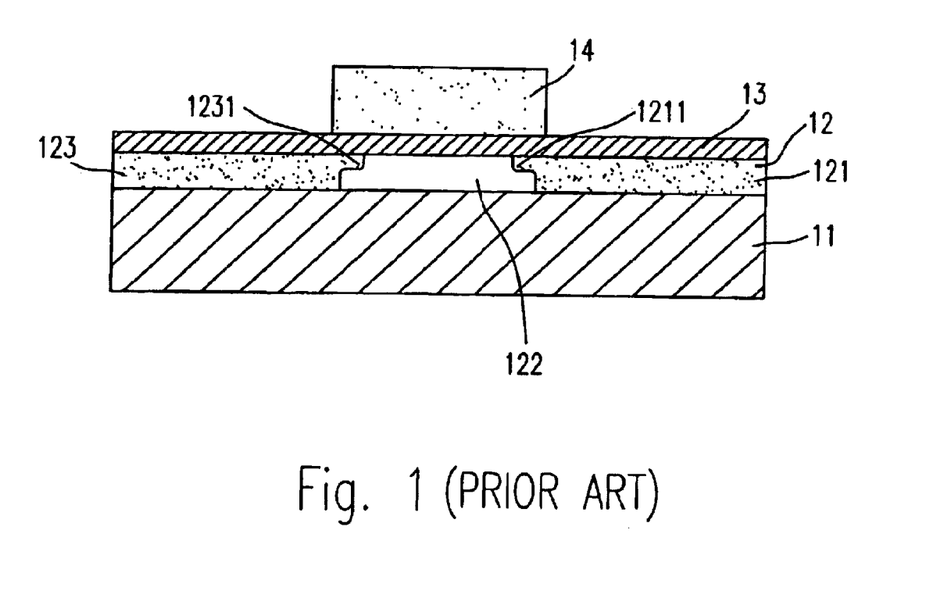
FIG. 1 illustrates a lightly doped drain structure of the prior art for solving the problem of the off-state leakage current.

Presently, someone provides a lightly doped drain structure and a field induced drain structure for preventing TFT-LCD from the off-state leakage current. FIG. 1 illustrates a lightly doped drain structure of the prior art for solving the problem of the off-state leakage current. The structure includes an insulating substrate 11, a source/drain layer 12, a gate insulating layer 13 and a gate layer 14, wherein the source/drain layer 12 further includes a drain 121, a lightly doped drain 1211, a channel 122, a source 123 and a lightly doped source 1231. The electric field of the drain 121 is reduced by means of adding lightly doped regions (i.e. the lightly doped drain 1211 and the lightly doped source 1231) corresponding to the original source 123 and the original drain 121 respectively near the channel 122, so as to prevent from the leakage current. However the TFT-LCD with the lightly doped regions is complex and hard to manufacture. Furthermore the resistance will increases because of the lightly doped degree. As result of the series resistance of the drain 121 and the source 123 increasing, the operating speed of the device reduces and the power dissipation increases.

Moreover, another improving structure of field-induction drain has been disclosed. However it has to add an extra photolithographic process for manufacturing the improving structure. The more photolithographic processes are introduced, the more mis-alignment and infected defects are resulted. Therefore, the cost and the manufacturing time of the improving structure must increase and the yield reduces.

Hence, the present invention is attempted to improve the prior art and provides a structure of a thin film transistor applied to a TFT-LCD and a manufacturing method thereof for preventing TFT-LCD from the leakage current.

SUMMARY OF THE INVENTION

It is one object of the present invention to provide a structure of a thin film transistor applied to TFT-LCD and a manufacturing method thereof It is another object of the present invention to provide a structure of a thin film transistor and a manufacturing method thereof for preventing TFT-LCD from the leakage current.

According to the present invention, the method for manufacturing a thin film transistor, includes steps of providing an insulating substrate, sequentially forming a source/drain layer, a primary gate insulating layer, and a first conducting layer on the insulating substrate, etching the first conducting layer to form a primary gate, sequentially forming a secondary gate insulating layer and a second conducting layer on the primary gate, and etching the second conducting layer to form a first secondary gate and a second secondary gate.

Certainly, the insulating substrate can be a glass.

Certainly, the source/drain layer can be a high-doping semiconductor layer.

Certainly, the high-doping semiconductor layer can be high-doping polycrystalline silicon.

Preferably, the source/drain layer includes a drain, a channel and a source.

Preferably, the channel has a length equal to a sum of a length of the primary gate, a width of the secondary insulating layer, a length of the first secondary gate and a length of the second secondary gate.

Certainly, the primary gate insulating layer can be one selected from a silicon nitride ($SiN_x$), a silicon oxide ($SiN_x$), a silicon oxide nitride ($SiO_xN_y$), a tantalum oxide ($TaO_x$), an aluminum oxide ($AlO_x$) and a mixture thereof.

Certainly, the first conducting layer can be one selected from chromium (Cr), molybdenum (Mo), tantalum (Ta), tantalum molybdenum (TaMo), tungsten molybdenum (WMo), aluminum (Al), aluminum silicon (AlSi), copper (Cu) and a mixture thereof.

Certainly, the step (c) can be executed by means of a reactive ion etching.

Certainly, the secondary gate insulating layer can be one selected from a silicon nitride ($SiN_x$), a silicon oxide ($SiN_x$), a silicon oxide nitride ($SiO_xN_y$), a tantalum oxide ($TaO_x$), an aluminum oxide ($AlO_x$) and a mixture thereof.

Certainly, the second conducting layer can be one selected from chromium (Cr), molybdenum (Mo), tantalum (Ta), tantalum molybdenum (TaMo), tungsten molybdenum (WMo), aluminum (Al), aluminum silicon (AlSi), copper (Cu) and a mixture thereof Certainly, the step (e) can be executed by means of a reactive ion etching.

According to the present invention, the structure of a thin film transistor includes an insulating substrate, a source/drain layer disposed on the insulating substrate, a primary insulating layer disposed on the source/drain layer, a primary gate disposed on the primary insulating layer, a secondary insulating layer disposed on the primary insulating layer, and a secondary gate disposed on the secondary insulating layer and insulated from the primary gate via the secondary insulating layer.

Preferably, the secondary insulating layer further includes a first secondary insulating layer and a second secondary insulating layer.

Preferably, the secondary gate further includes a first secondary gate and a second secondary gate disposed on the first secondary insulating layer and the second secondary insulating layer respectively.

Certainly, the insulating substrate can be a glass.

Certainly, the source/drain layer can be a high-doping semiconductor layer.

Certainly, the high-doping semiconductor layer can be high-doping polycrystalline silicon.

Preferably, the source/drain layer includes a drain, a channel and a source.

Preferably, the channel has a length equal to a sum of a length of the primary gate, a width of the secondary insulating layer, and a length of the secondary gate.

Certainly, the primary gate insulating layer can be one selected from a silicon nitride ($SiN_x$), a silicon oxide ($SiN_x$), a silicon oxide nitride ($SiO_xN_y$), a tantalum oxide ($TaO_x$), an aluminum oxide ($AlO_x$) and a mixture thereof Certainly, the first conducting layer can be one selected from chromium (Cr), molybdenum (Mo), tantalum (Ta), tantalum molybdenum (TaMo), tungsten molybdenum (WMo), aluminum (Al), aluminum silicon (AlSi), copper (Cu) and a mixture thereof.

Certainly, the primary gate can be formed by means of a reactive ion etching.

Certainly, the secondary gate insulating layer can be one selected from a silicon nitride ($SiN_x$), a silicon oxide ($SiN_x$), a silicon oxide nitride ($SiO_xN_y$), a tantalum oxide ($TaO_x$), an aluminum oxide ($AlO_x$) and a mixture thereof Certainly, the second conducting layer can be one selected from chromium (Cr), molybdenum (Mo), tantalum (Ta), tantalum molybdenum (TaMo), tungsten molybdenum (WMo), aluminum (Al), aluminum silicon (AlSi), copper (Cu) and a mixture thereof Certainly, the secondary gate can be formed by means of a reactive ion etching.

According to the present invention, the structure of a thin film transistor includes an insulating substrate, a source/drain layer disposed on the insulating substrate, a primary insulating layer disposed on the source/drain layer, a primary gate disposed on the primary insulating layer, at least a secondary insulating layer disposed on the primary insulating layer, and at least a secondary gate disposed on the at least a secondary insulating layer and insulated from the primary gate via the at least a secondary insulating layer.

Certainly, the insulating substrate can be a glass.

Certainly, the source/drain layer can be a high-doping semiconductor layer.

Certainly, the high-doping semiconductor layer can be high-doping polycrystalline silicon.

Preferably, the source/drain layer includes a drain, a channel and a source.

Preferably, the channel has a length equal to a sum of a length of the primary gate, a width of the at least secondary insulating layer, and a length of the at least a secondary gate.

Certainly, the primary gate insulating layer can be one selected from a silicon nitride ($SiN_x$), a silicon oxide ($SiN_x$), a silicon oxide nitride ($SiO_xN_y$), a tantalum oxide ($TaO_x$), an aluminum oxide ($AlO_x$) and a mixture thereof.

Certainly, the at least a secondary gate insulating layer can be one selected from a silicon nitride ($SiN_x$), a silicon oxide ($SiN_x$), a silicon oxide nitride ($SiO_xN_y$), a tantalum oxide ($TaO_x$), an aluminum oxide ($AlO_x$) and a mixture thereof.

Now the foregoing and other features and advantages of the present invention will be more clearly understood through the following descriptions with reference to the drawings, wherein:

DETAILED DESCRIPTION OF THE PREFERRED EMBODIMENT

FIGS. 2(a)–2(d) illustrate the steps of manufacturing the thin film transistor according to the preferred embodiment of the present invention. The method for manufacturing a thin film transistor includes several steps. First, an insulating substrate 21 is provided and a source/drain layer 22, a primary gate insulating layer 23, and a first conducting layer 241 are sequentially formed on the insulating substrate 21, shown in FIG. 2(a). Secondly, the first conducting layer 241 is etched to form a primary gate 24, shown in FIG. 2(b). Thirdly, a secondary gate insulating layer 25 and a second conducting layer 26 are sequentially formed on the primary gate 24, shown in FIG. 2(c). Finally, the second conducting layer 26 and the secondary gate insulating layer 25 are etched to respectively form a first secondary gate 271 and a second secondary gate 272, and a first secondary gate insulating layer 251 and a second secondary gate insulating layer 252, shown in FIG. 2(d). As to FIG. 2(e), it illustrates the bias status of the thin film transistor including a source bias voltage (VS) 28, a gate/source bias voltage (VGS) 29 and a drain/source bias voltage (VDS) 210.

According to the above embodiment of the present invention, the insulating substrate 21 is a glass substrate, the source/drain layer 22 is a high-doping semiconductor layer, and the high-doping semiconductor layer is high-doping polycrystalline silicon. Furthermore, the source/drain layer 22 includes a drain 221, a channel 222 and a source 223. Meanwhile, the channel 222 has a length equal to a sum of a length of the primary gate 24, a width of the first secondary insulating layer 251 and the second secondary insulting layer 252, a length of the first secondary gate 271 and the second secondary gate 272.

Figure 2A:
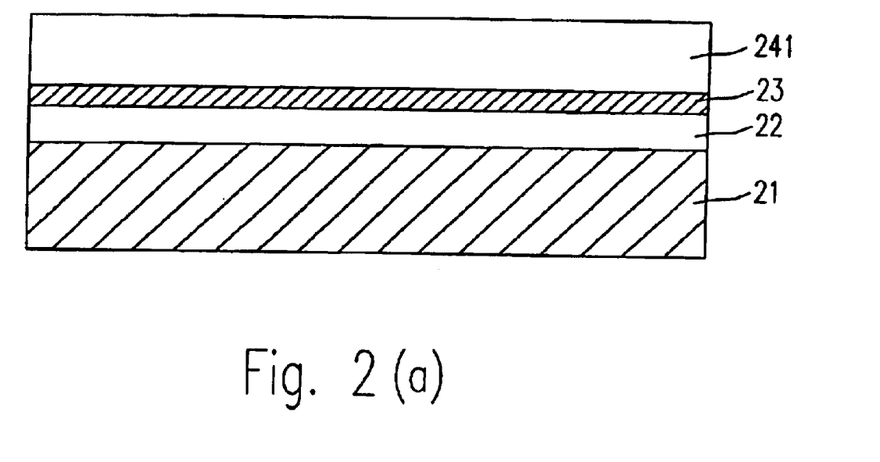
FIGS. 2(a)–2(e) illustrate the steps of manufacturing the thin film transistor according to the preferred embodiment of the present invention.
Figure 2B:
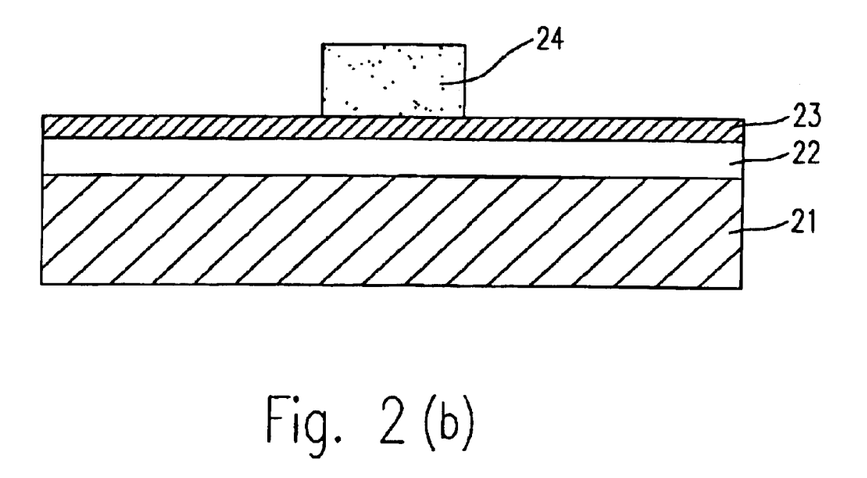
Figure 2C:
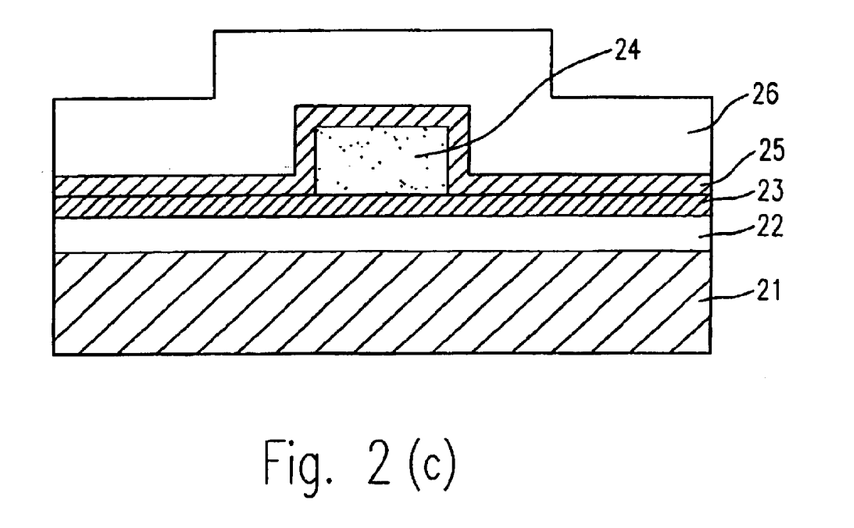
Figure 2D:
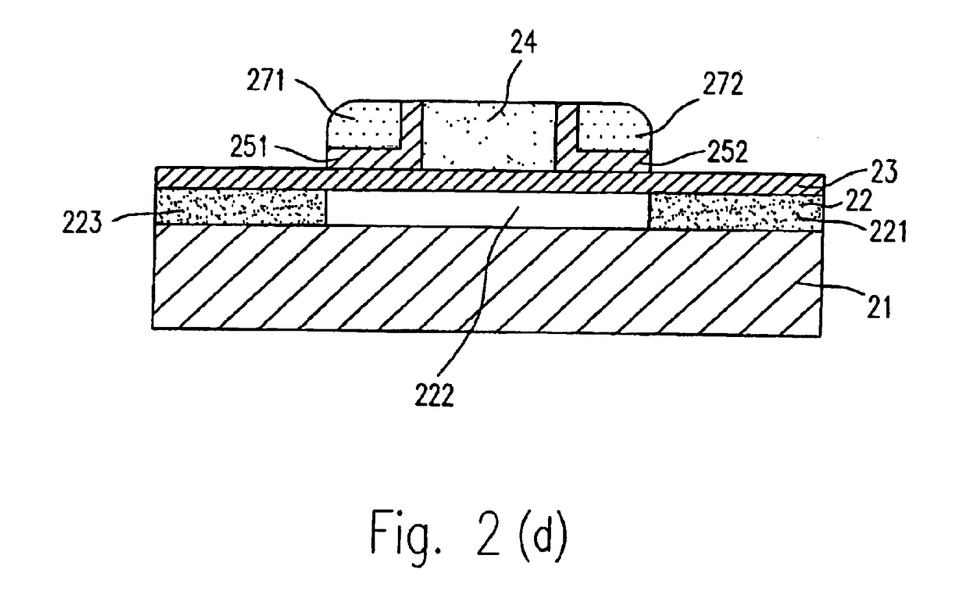
Figure 2E:
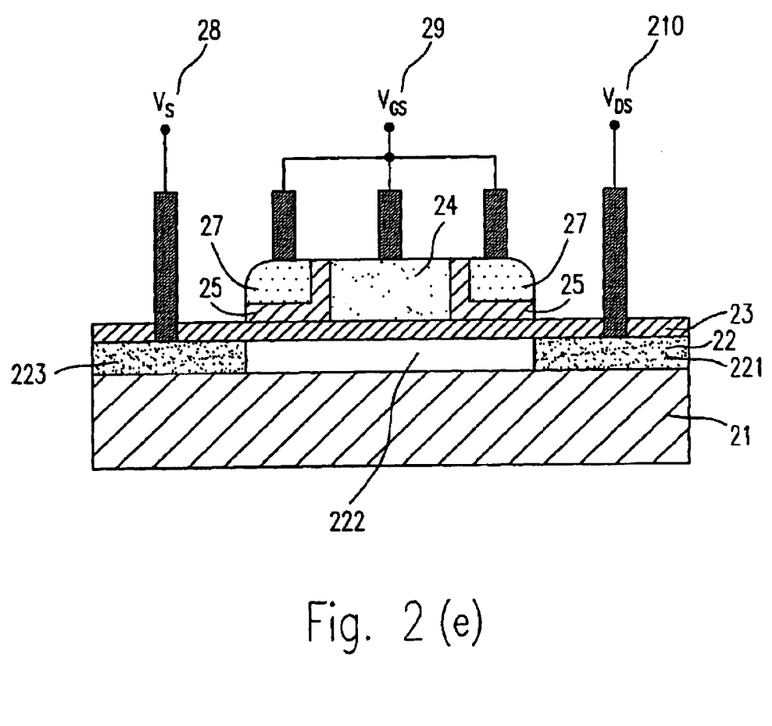

As to the primary gate insulating layer 23 and the secondary gate insulating layer 25, they can be one selected from a silicon nitride ($SiN_x$), a silicon oxide ($SiN_x$), a silicon oxide nitride ($SiO_xN_y$), a tantalum oxide ($TaO_x$), an aluminum oxide ($AlO_x$) and a mixture thereof. However the first conducting layer 241 and the second conducting layer 26 are one selected from chromium (Cr), molybdenum (Mo), tantalum (Ta), tantalum molybdenum (TaMo), tungsten molybdenum (WMo), aluminum (Al), aluminum silicon (AlSi), copper (Cu) and a mixture thereof Meanwhile, the first conducting layer 241, the second conducting layer 26 and the secondary gate insulating layer 25 are etched by means of a reactive ion etching.

Figure 3:
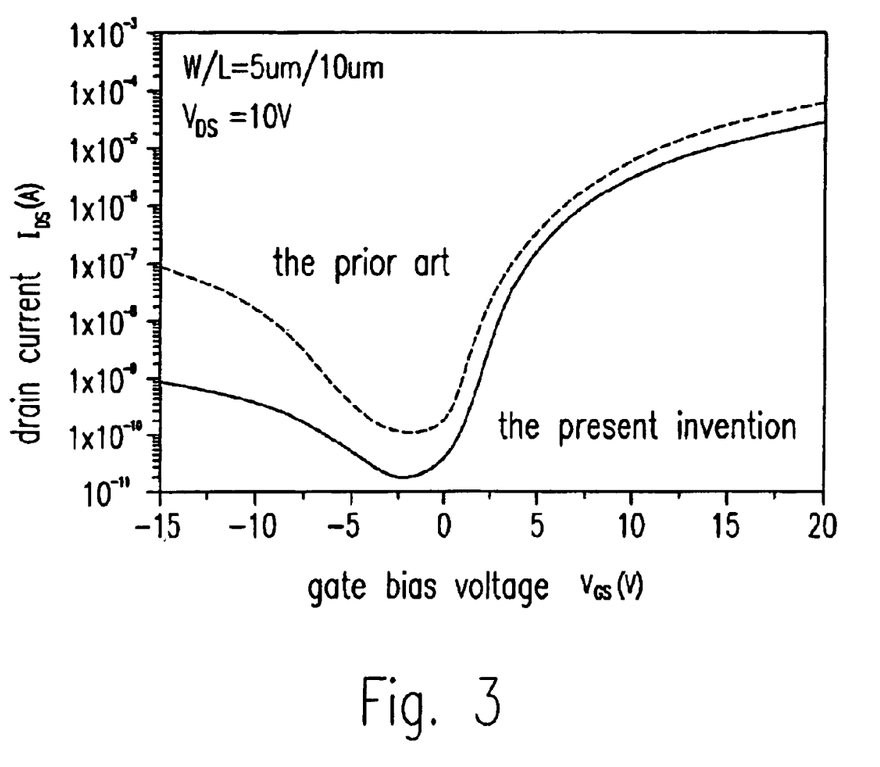
FIG. 3 illustrates electricity properties of the present invention compared with those of the prior art.

Referring to FIG. 3, it illustrates electricity properties of the present invention compared with those of the prior art. As result of operating the thin film transistor according to the bias status of FIG. 2(e), the thin film transistor of the present invention causes a lower leakage current. In FIG. 3, when the thin film transistor of the present invention and the thin film transistor of the prior art are operated in the same condition (VDS=10V), the leakage current caused by the present invention is lower than that caused by the prior art. While VDS=15V, the leakage current ($1 \times 10^{-9}$A) of the present invention is 100 times as that ($1 \times 10^{-7}$A) of the prior art.

Accordingly, the present invention reduces the electric field of the drain region by means of providing a thicker gate insulating layer, so as to improve the problem of the high off-state leakage current of a thin film transistor. Comparing with the prior art, the present invention introduces four photolithographic processes equal to the traditional one, but doesn't have to add an extra photolithographic process. Therefore, the present invention can solve the drawbacks of the prior art and be practicability.

Although the present invention has been described and illustrated in detail, it is to be clearly understood that the same is by the way of illustration and example only and is not to be taken by way of limitation, the spirit and scope of the present invention being limited only by the terms of the appended claims.

What is claimed is:

1. A structure of a thin film transistor applied to TFT-LCD, comprising:
   an insulating substrate;
   a source/drain layer disposed on said insulating substrate;
   a primary insulating layer disposed on said source/drain layer;
   a primary gate disposed on said primary insulating layer;
   a secondary insulating layer disposed on said primary insulating layer; and
   secondary gate disposed on said secondary insulating layer and insulated from said primary gate via said secondary insulating layer, and electrically connected to said primary gate.

2. The structure according to claim 1, wherein said secondary insulating layer further comprises a first secondary insulating layer and a second secondary insulating layer.

3. The structure according to claim 2, wherein said secondary gate further comprises a first secondary gate and a second secondary gate disposed on said first secondary insulating layer and said second secondary insulating layer respectively.

4. The structure according to claim 1, wherein said insulating substrate is a glass.

5. The structure according to claim 1, wherein said source/drain layer is a high-doping semiconductor layer.

6. The structure according to claim 5, wherein said high-doping semiconductor layer is high-doping polycrystalline silicon.

7. The structure according to claim 1, wherein said source/drain layer comprises a drain, a channel and a source.

8. The structure according to claim 7, wherein said channel has a length equal to a sum of a length of said primary gate, a width of said secondary insulating layer, and a length of said secondary gate.

9. The structure according to claim 1, wherein said primary gate insulating layer is one selected from a silicon nitride ($SiN_x$), a silicon oxide ($SiO_x$), a silicon oxide nitride ($SiO_xN_y$), a tantalum oxide ($TaO_x$), an aluminum oxide ($AlO_x$) and a mixture thereof.

10. The structure according to claim 3, wherein said first secondary gate is one selected from chromium (Cr), molybdenum (Mo), tantalum (Ta), tantalum molybdenum (TaMo), tungsten molybdenum (WMo), aluminum (Al), aluminum silicon (AlSi), copper (Cu) and a mixture thereof.

11. The structure according to claim 1, wherein said primary gate is formed by means of a reactive ion etching.

12. The structure according to claim 1, wherein said secondary gate insulating layer is one selected from a silicon nitride ($SiN_x$), a silicon oxide ($SiO_x$), a silicon oxide nitride ($SiO_xN_y$), a tantalum oxide ($TaO_x$), an aluminum oxide ($AlO_x$) and a mixture thereof.

13. The structure according to claim 3, wherein said second secondary gate is one selected from chromium (Cr), molybdenum (Mo), tantalum (Ta), tantalum molybdenum (TaMo), tungsten molybdenum (WMo), aluminum (Al), aluminum silicon (AlSi), copper (Cu) and a mixture thereof.

14. The structure according to claim 1, wherein said secondary gate is formed by means of a reactive ion etching.

15. A structure of a thin film transistor applied to TFT-LCD, comprising:
   an insulating substrate;
   a source/drain layer disposed on said insulating substrate;
   a primary insulating layer disposed on said source/drain layer;
   a primary gate disposed on said primary insulating layer;
   at least a secondary insulating layer disposed on said primary insulating layer; and
   at least a secondary gate disposed on said at least a secondary insulating layer and insulated from said primary gate via said at least a secondary insulating layer, and electrically connected to said primary gate.

16. The structure according to claim 15, wherein said insulating substrate is a glass.

17. The structure according to claim 15, wherein said source/drain layer is a high-doping semiconductor layer.

18. The structure according to claim 17, wherein said high-doping semiconductor layer is high-doping polycrystalline silicon.

19. The structure according to claim 15, wherein said source/drain layer comprises a drain, a channel and a source.

20. The structure according to claim 19, wherein said channel has a length equal to a sum of a length of said primary gate, a width of said at least secondary insulating layer, and a length of said at least a secondary gate.

21. The structure according to claim 15, wherein said primary gate insulating layer is one selected from a silicon nitride ($SiN_x$), a silicon oxide ($SiO_x$), a silicon oxide nitride ($SiO_xN_y$), a tantalum oxide ($TaO_x$), an aluminum oxide ($AlO_x$) and a mixture thereof.

22. The structure according to claim 17, wherein said at least a secondary gate insulating layer is one selected from a silicon nitride ($SiN_x$), a silicon oxide ($SiO_x$), a silicon oxide nitride ($SiO_xN_y$), a tantalum oxide ($TaO_x$), an aluminum oxide ($AlO_x$) and a mixture thereof.

* * * * *

UNITED STATES PATENT AND TRADEMARK OFFICE
CERTIFICATE OF CORRECTION

PATENT NO. : 6,969,890 B2
DATED : November 29, 2005
INVENTOR(S) : Kow Ming Chang and Yuan Hung Chung It is certified that error appears in the above-identified patent and that said Letters Patent is hereby corrected as shown below:

Column 3,
Lines 7, 19 and 24, insert -- . -- after "thereof".

Signed and Sealed this

Twenty-first Day of February, 2006

JON W. DUDAS
*Director of the United States Patent and Trademark Office*